United States Patent
Tohyama et al.

(10) Patent No.: US 6,703,603 B2
(45) Date of Patent: Mar. 9, 2004

(54) CONTROLLER FOR OPTICAL SCANNER

(75) Inventors: Souichi Tohyama, Tsuchiura (JP);
Hiromu Hirai, Tsuchiura (JP); Kichio Nakajima, Tsuchiura (JP); Atsushi Sakamoto, Tsuchiura (JP); Yaichi Okubo, Ebina (JP); Masahiro Oishi, Ebina (JP)

(73) Assignee: Hitachi Via Mechanics, Ltd., Ebina (JP)

( * ) Notice: Subject to any disclaimer, the term of this patent is extended or adjusted under 35 U.S.C. 154(b) by 209 days.

(21) Appl. No.: 09/996,698

(22) Filed: Nov. 30, 2001

(65) Prior Publication Data

US 2003/0102427 A1 Jun. 5, 2003

(51) Int. Cl.[7] .......................... H01J 40/14; G02B 26/08
(52) U.S. Cl. ...................... 250/234; 250/236; 359/223; 359/226
(58) Field of Search ................................. 250/234, 235, 250/236, 214 R; 359/198, 199, 200, 212, 223, 226, 877; 358/474

(56) References Cited

U.S. PATENT DOCUMENTS

| | | | |
|---|---|---|---|
| 3,517,282 A | 6/1970 | Miller | 317/249 |
| 4,864,295 A | 9/1989 | Rohr | 340/870.37 |
| 5,347,124 A | 9/1994 | Narukawa et al. | |
| 5,469,289 A | 11/1995 | Iwao et al. | |
| 6,069,726 A * | 5/2000 | Hughes | 359/223 |
| 2002/0163675 A1 * | 11/2002 | Sakai | 358/474 |

FOREIGN PATENT DOCUMENTS

| | | |
|---|---|---|
| JP | 63147138 | 6/1988 |
| JP | 4127981 | 4/1992 |
| JP | 08022529 | 1/1996 |
| JP | 7055500 | 7/1996 |
| WO | 01/33280 | 5/2001 |

* cited by examiner

*Primary Examiner*—Kevin Pyo
(74) *Attorney, Agent, or Firm*—Crowell & Moring LLP

(57) ABSTRACT

A controller for an optical scanner includes a mirror angle detecting unit for detecting an angle of a mirror, a rotation shaft angle detecting unit for detecting an angle of the shaft, a current detecting unit for detecting a current supplied to a motor, and a torsional vibration stabilizing compensation unit for stabilizing a torsional vibration of the shaft, thereby a value subjected to a proportional compensation and a differential compensation by using a rotation shaft angle detected value and a value from the torsional vibration stabilizing compensation unit are negatively fed back to a value obtained by integrally compensating for a tracking error between the angle desired value and a mirror angle detection value to determine a current value to be supplied to the motor.

10 Claims, 10 Drawing Sheets

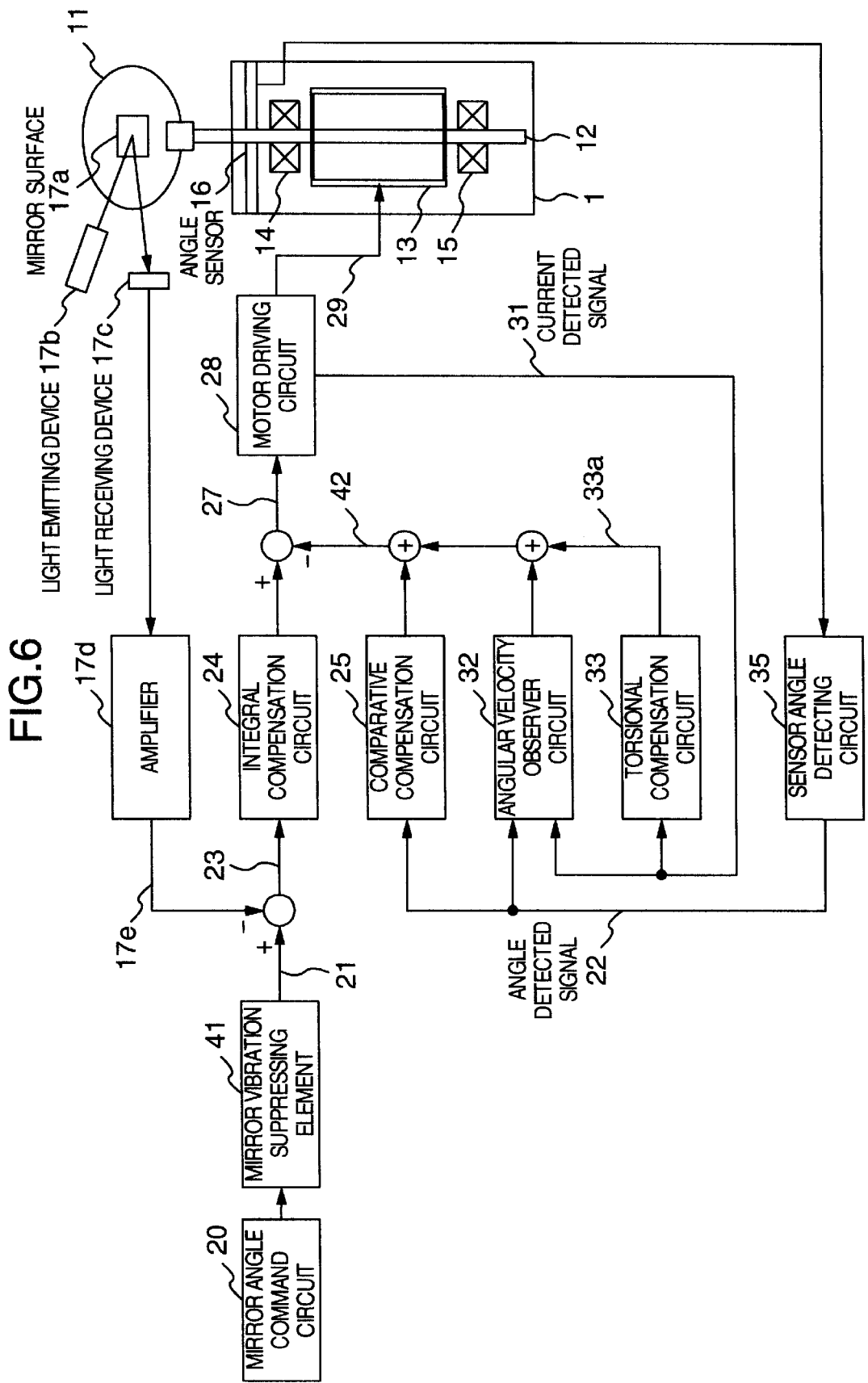

CONTROLLER FOR OPTICAL SCANNER

BACKGROUND OF THE INVENTION

1. Field of the Invention

The present invention relates to a controller for an optical scanner including an angle detecting unit and adapted to position a mirror supported by an axis of rotation.

In an optical scanner used in the laser marking and the laser drilling through a printed wiring board using a laser beam, a mirror mounted on the rotation shaft is rotated by an electric motor having the mirror therewith to change the angle of the mirror, whereby a laser beam emitted from a laser oscillator is irradiated on a predetermined position of an object to be fabricated.

2. Description of the Related Art

FIG. 12 is a schematic view showing the construction of a movable part in the optical scanner. A mirror 11 is mounted on an end of a rotation shaft 12. The rotation shaft 12 is supported by a bearing 14 and a bearing 15 and is rotated by suffering the driving torque by a moving coil 13 incorporated integrally with the rotation shaft 12 to be positioned to a predetermined angle. Hereinafter, the mirror 11, the rotation shaft 12 and the moving coil 13 which are rotated integrally are collectively referred to as an optical scanner 1" for short when applicable.

The optical scanner 1 has an angle detecting sensor (not shown) for detecting the rotation angle of the rotation shaft 12, e,g., a variable capacitance type sensor. The variable capacitance type sensor is configured in such a way that a dielectric plate mounted on a rotation shaft is rotated together with the rotation shaft between a set of two fixed electrode plates. Then, the angle of the rotation shaft is detected in the form of an electrical signal as the change in the electrostatic capacity between the electrode plates. The technique of such a variable capacitance type sensor, for example, is disclosed in U.S. Pat. No. 3,517,282, U.S. Pat. No. 4,864,295 and JP-A-7-55500.

In addition, JP-A-4-127981 discloses a technique that a laser beam for measuring an angle is irradiated on a mirror and the reflected light beam is detected by a linear sensor to control the mirror angle in the feedback control. Furthermore, JP-A-63-147138 discloses a technique that a reflecting surface is formed on a component (mirror mount) to be fixed a mirror on a rotation shaft and the light beam emitted from a light emitting device reflected from the reflecting surface is detected by a light receiving device, thereby positioning the mirror.

FIG. 13 is a servo block diagram showing a configuration of the optical scanner. In order that an angle detection signal 22 is negatively fed back to an angle desired value signal 21 supplied from a host controller to make zero a value of a tracking error signal 23, the tracking error signal 23 is integrated by an integral compensation circuit 24. In addition, in order to maintain the stability of this servo mechanism, the angle detection signal 22 is inputted to both a proportional compensation circuit 25 and a derivative compensation circuit 26, and the sum of the output signals from these circuits is subtracted from an output signal of the integral compensation circuit 24 to make the resultant signal a control input signal 27. A motor driving circuit 28 supplies a motor driving current 29 proportional to the control input signal 27 to the optical scanner 1. The motor driving current 29 flows through a moving coil 13, thus, the driving torque proportional to the current value acts on the moving coil.

In the case where holes are formed through a printed wiring board by the laser beam, in order to form the holes through the fine circuit pattern with high accuracy, it is necessary to make the positioning error which should be equal to or smaller than about 10 $\mu$m when forming the holes. In addition, in order to shorten the laser drilling time, the enhancement of the drilling speed is required for the movement up to the drilling position of a next hole after completion of the one hole. For example, in the case where 1,000 holes are formed per second, the time required for the movement between the holes needs to be made shorter than 1 ms in average.

Now, the laser beam has the energy distribution and is made incident to the mirror 11 with the area extend held. For this reason, in order to form the high quality holes, it is desirable that the size of mirror 11 is large (i.e., the area thereof is large).

However, if the size of mirror 11 increases, then the torsional vibration and the flexural vibration of the rotation shaft 12 are both increased, which results in the impediment of the high response of the mirror positioning.

First of all, the description will be given with respect to the influence of the torsional vibration. If the size of mirror 11 increases, the moment of inertia around the rotation shaft 12 also increases, therefore, the natural frequency of the torsional vibration acting by the rotation shaft 12 decreases. The natural frequency of the first mode is minimum. One node of the torsion is then present in the longitudinal direction of the rotation shaft 12 and the both sides sandwiching the node are subjected to the angular displacement in an opposite phase. In addition, the natural frequency of the second mode is low next to that of the first mode. Two nodes are therefore present in the longitudinal direction of the rotation shaft 12, and the both sides of the central part sandwiched between the two nodes are vibrated in the opposite phase with respect to that central part.

For example, when the angle detecting sensor is close to the mirror, the node of the torsional vibration is located between the angle detecting sensor and the moving coil 13, whereby the angle detecting sensor and the moving coil 13 may be subjected to the angular displacement in the opposite phase in some cases. In such cases, in the above-mentioned servo mechanism, the torsional vibration frequency component of the angle detection signal 22 is positively fed back, so that the control becomes unstable. Though the control bandwidth is desirably wider in terms of the characteristics of the high response of the mirror positioning and the suppression of the low frequency disturbance, the control bandwidth is limited due to the torsional vibration.

In addition, when the node of torsional vibration overlaps the position of sensor or is located close to the sensor, since the vibration mode thereof can not be observed by the angle detecting sensor, the stabilization can not be obtained in terms of the control and hence the accuracy of positioning the laser beam is reduced.

Next, the description will hereinbelow be given with respect to the influence of the flexural vibration. It is desirable that the movable part of the optical scanner shown in FIG. 12 is balanced around the rotation shaft 12. However, if the mass of mirror with respect to the two sides of the moving coil 13 in the longitudinal direction which is subjected to the driving torque or the mass of mirror with respect to the axis line of rotation shaft 12 is different between the left and right sides thereof, the mass difference becomes the unbalance weight. The flexural vibration is then generated on the rotation shaft 12 with the rotation shaft 12 supported by the bearing 14 and the bearing 15 due to the force of inertia caused by the unbalance weight resulting from the operation of the optical scanner 1. As a result, the mirror 11 vibrates in the parallel direction or in the perpendicular direction with respect to the mirror surface. In general, the optical scanner 1 does not have a sensor for detecting the flexural vibration of the rotation shaft 12 and an actuator for applying the force in the direction of the flexural vibration to the rotation shaft 12. In addition, in the feedback control made by the above-mentioned servo mechanism, it is impossible to attenuate the flexural vibration which has been generated once. For this reason, it is impossible to enhance the accuracy of positioning the laser beam.

SUMMARY OF THE INVENTION

In the light of the foregoing, it is therefore an object of the present invention to provide a controller for an optical scanner capable of reducing the torsional vibration and the flexural vibration to be generated on a rotation shaft having a mirror mounted thereon to shorten the time required to position the mirror and to enhance further the accuracy of positioning a laser beam.

In order to attain the above-mentioned object, according to the first aspect of the present invention, there is provided a controller for an optical scanner for positioning a mirror supported by a rotation shaft around the axis on the basis of an angle desired value and an angle detection value, wherein a correction value with respect to the torsional vibration of the rotation shaft is added to an integration value of the tracking error between the angle desired value and the angle detection value, reducing the torsional vibration of the rotation shaft.

In this case, the above-mentioned correction value can be made an output value of the transfer function up to the r-th order (but, r is positive integer) angular velocity of the torsional vibration of the above-mentioned rotation shaft due to the driving torque added to the above-mentioned rotation shaft, and furthermore, the output value of the above-mentioned transfer function can be calculated from the current value supplied to the motor by which the driving torque is generated.

In addition, there is provided a controller for an optical scanner for positioning a mirror supported by a rotation shaft on the basis of an angle desired value and an angle detection value, wherein a target trajectory is made a time function of a position, and also a specific frequency component is removed from the target trajectory, and from the sum of a target velocity and a target acceleration based on the target trajectory to make the resultant value the above-mentioned angle desired value, reducing the flexural vibration of the rotation shaft.

In this case, the above-mentioned specific frequency component can be decided as the natural frequency component of the flexural vibration of the rotation shaft, or as the natural frequency component of the torsional vibration of the rotation shaft.

According to the second aspect of the present invention, there is provided a controller for an optical scanner for determining an angle of a mirror supported by a rotation shaft on the basis of an angle desired value and an angle detection value, wherein the controller includes: a mirror angle detecting unit for detecting an angle of the mirror; a rotation shaft angle detecting unit for detecting an angle of the rotation shaft; a current detecting unit for detecting a current supplied to a motor for rotating the rotation shaft; and a torsional vibration stabilizing compensation unit for stabilizing the torsional vibration on the basis of the current value, wherein the value from the proportional compensation and the derivative compensation both using the rotation shaft angle detected value and the value from the torsional vibration stabilizing compensation unit are negatively fed back to the value integrally compensated the tracking error between the angle desired value and the mirror angle detection value to determine the current value supplied to the motor, reducing the torsional vibration of the rotation shaft.

BRIEF DESCRIPTION OF THE DRAWINGS

The above and other objects as well as advantages of the present invention will become clear by the following description of the embodiments of the present invention with reference to the accompanying drawings, wherein:

FIG. 6 is a block diagram showing another configuration of a controller for an optical scanner according to the present invention;

DETAILED DESCRIPTION OF THE EMBODIMENTS

Figure 12:
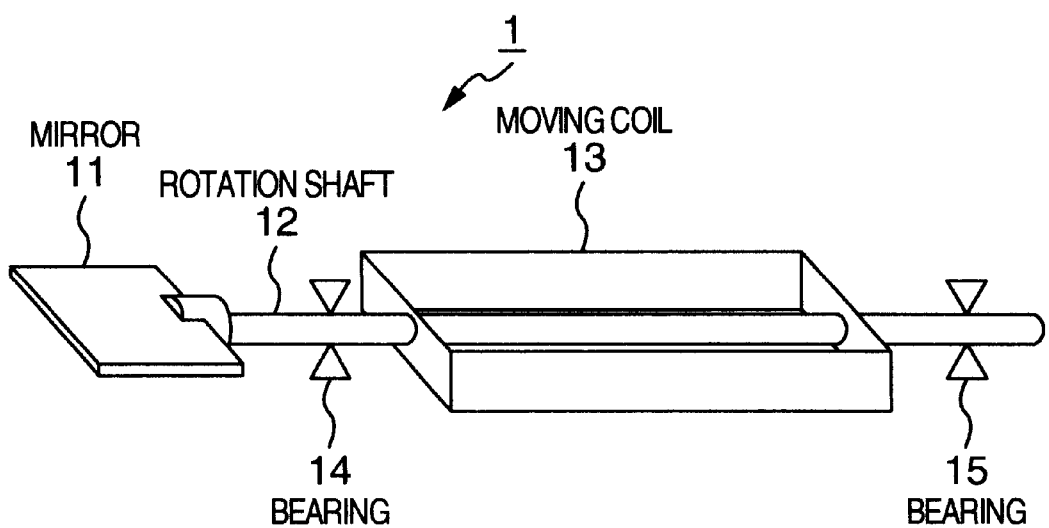
FIG. 12 is a schematic perspective view showing construction of a movable part of an optical scanner.
Figure 13:
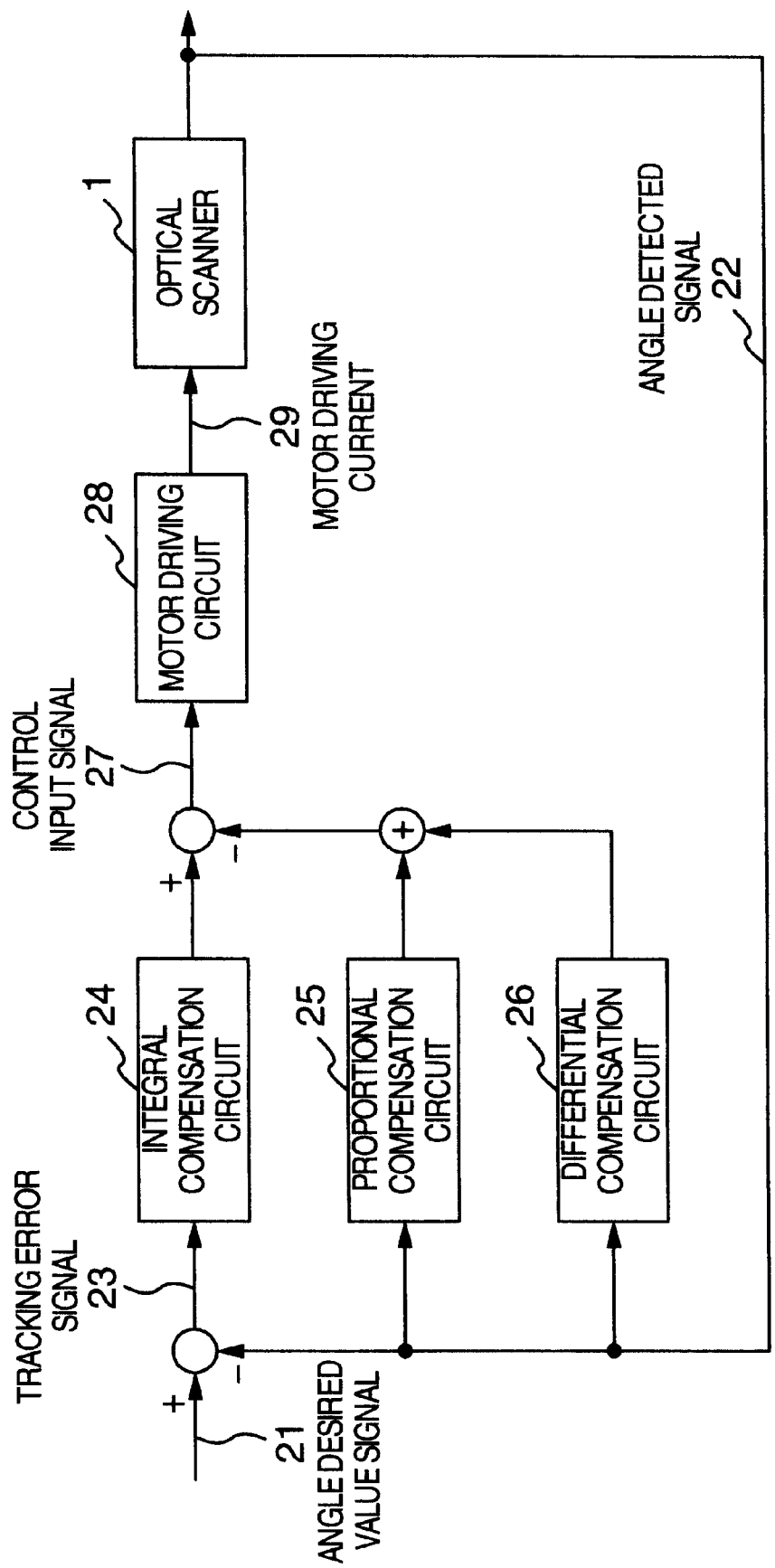
FIG. 13 is a servo block diagram showing a configuration of an optical scanner.

First of all, the principles of the present invention will hereinafter be described the torsional vibration with reference to FIG. 12 and FIG. 13 again.

The frequency response (the self-compliance) from the driving torque applied to the moving coil 13 to the angular displacement of the moving coil 13 is represented by a transfer function $G(s)$ of Expression 1.

$$G(s) = \frac{k_0}{s^2} + \sum_{n=1}^{\infty} \frac{k_n \omega_n^2}{s^2 + 2\zeta_n \omega_n s + \omega_n^2} \quad (1)$$

where s is a complex variable of Laplace transformation, n is a variable representing the torsional vibration n-th order mode (but, n is integer), $\omega_n$ is a natural frequency of the torsion vibration n-th order mode, $\zeta_n$ is an attenuation coefficient of the torsion vibration n-th order mode, $k_o$ is a constant relating to the rigid body mode, and $k_n$ is a mode constant of the torsion vibration n-th order mode.

Now, paying attention to the specific torsion vibration mode (r-th order mode), the transfer function $G_r(S)$ indicated by expression (2) is a transfer function from the driving torque to the angular displacement of the r-th order mode in the position of the moving coil 13, and $H_r(S)$ shown in expression (3) is a transfer function from the driving torque to the angular velocity of the r-th order mode in the position of the moving coil 13.

$$G_r(s) = \frac{k_r \omega_r^2}{s^2 + 2\zeta_r \omega_r s + \omega_r^2} \quad (2)$$

$$H_t(s) = s \cdot G_r(s) = \frac{k_r \omega_r^2 s}{s^2 + 2\zeta_r \omega_r s + \omega_r^2} \quad (3)$$

Since the transfer function $H_r(s)$ represents the response (self-frequency response) in the position on which the driving torque operates, thus, the mode constant kr is positive. Therefore, if the value of the transfer function $H_r(S)$ is negatively fed back to the control input signal 27, the r-th order mode can be attenuated in terms of the control to be stabilized.

Now, in the case where the motor driving circuit 28 is of a current control system, normally, since the driving torque of the moving coil 13 is proportional to the motor driving current 29, the driving torque of the moving coil 13 becomes clear by measuring the motor driving current 29. For example, the motor driving current 29 corresponding to the value of motor driving current 29 flows through the current detecting resistor having a small resistance value (0.1 equal to or smaller than several Ω) and the voltage developed across that resistor is inputted to the differential input type subtraction circuit, whereby the current detection signal corresponding to the value of the motor driving current 29 can be obtained as an output of the differential input type subtraction circuit.

The embodiments of the present invention will hereinafter be described in detail with reference to the accompanying drawings.

Figure 1:
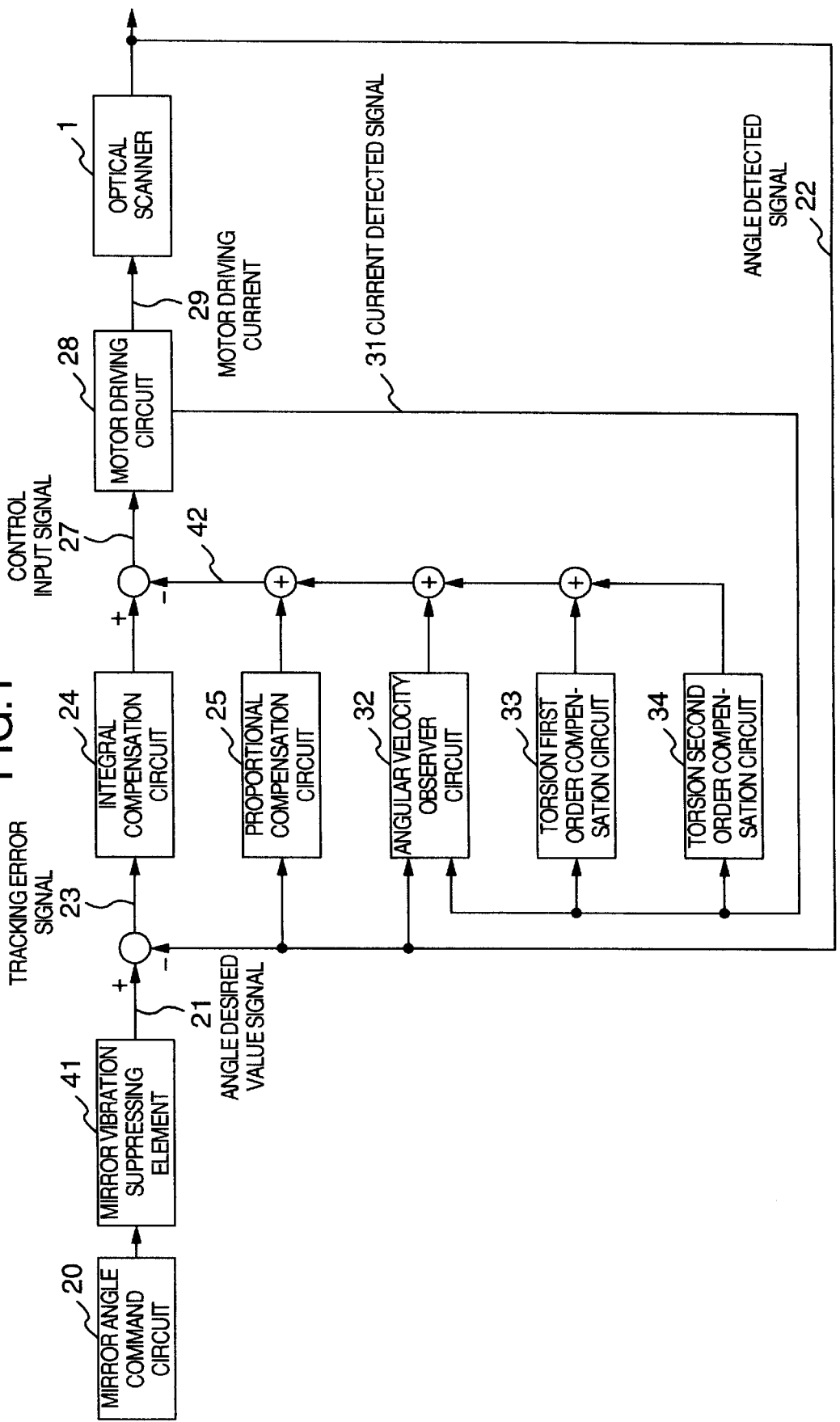
FIG. 1 is a control block diagram showing a configuration of an optical scanner according to the present invention.

FIG. 1 is a control block diagram showing a configuration of an optical scanner according to the present invention. The same constituent elements as those in FIG. 12 already described are designated with the same reference numerals and the description thereof is omitted for the sake of simplicity. The tracking error signal 23 obtained by feeding back negatively the angle detected signal 22 to the angle desired value signal 21 is integrated in the integral compensation circuit 24. In addition, in order to maintain the stability of this servo system, the angle detected signal 22 is inputted to a proportional compensation circuit 25 and an angular velocity observer circuit 32 which will described later.

In addition, a current detected signal 31 having magnitude corresponding to the current value supplied to the moving coil 13 is inputted to the angular velocity observer circuit 32, a torsion first order compensation circuit 33 and a torsion second order compensation circuit 34, both of which will be described later. A value 42 of the sum of the output signals from the proportional compensation circuit 25, the angular velocity observer circuit 32, the torsion first order compensation circuit 33 and the torsion second order compensation circuit 34 is subtracted from the output signal from the integral compensation circuit 24, and the resultant signal is made a control input signal 27. A mirror angle command circuit 20 and a mirror vibration suppressing element 41 will be described later.

Next, the torsion r-th order compensation circuit will hereinbelow be described later.

It is possible to be aware of the r-th order natural frequency and the attenuation coefficient by surveying the frequency response of the mirror 11. In addition, a second order filter (hereinafter, referred to as a torsion r-th order compensation circuit) having the frequency response characteristics proportional to the function represented by the expression (3) with the same sign indicated can be configured in terms of an electronic circuit.

Figure 2:
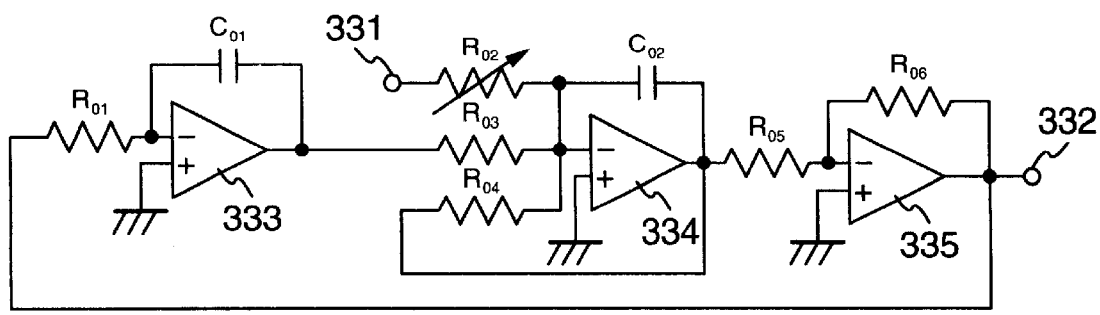
FIG. 2 is a circuit diagram showing a configuration of a torsion r-th order compensation circuit according to the present invention.

FIG. 2 shows such a torsion r-th order compensation circuit constituted by three operational amplifiers 333 to 335, six resistors $R_{01}$ to $R_{06}$ and two capacitors $C_{01}$ and $C_{02}$. Plus side input terminals of the operational amplifiers 333 to 335 are all grounded. A minus side input terminal of the operational amplifier 333 is then connected to one terminal of the resistor $R_{01}$ and one terminal of the capacitor $C_{01}$. An output terminal of the operational amplifier 333 is connected to the other terminal of the capacitor $C_{01}$ and one terminal of the resistor $R_{03}$. The other terminal of the resistor $R_{03}$ is connected to one terminals of the resistor $R_{02}$, the resistor $R_{04}$ and the capacitor $C_{02}$ and a minus side input terminal of the operational amplifier 334. An output terminal of the operational amplifier 334 is connected to the other terminal of the capacitor $C_{02}$, the other terminal of the resistor $R_{04}$ and one terminal of the resistor $R_{05}$. A minus side input terminal of the operational amplifier 335 is connected to the other terminal of the resistor $R_{05}$ and one terminal of the resistor $R_{06}$. An output terminal of the operational amplifier 335 is connected to the other terminal of the resistor $R_{06}$, the other terminal of the resistor $R_{01}$, and a terminal 332. Then, the other terminal of the resistor $R_{02}$ is connected to a terminal 331. Also, the resistor $R_{02}$ is a variable resistor.

In this circuit, if the resistance values of the resistor $R_{05}$ and the resistor $R_{06}$ are made equal to each other, then a transfer function $G_c(s)$ from the input signal inputted to the terminal 331 up to the output signal outputted through the terminal 332 is represented by expression (4).

$$G_c(s) = \frac{\frac{1}{R_{02}C_{02}}s}{s^2 + \frac{1}{R_{04}C_{02}}s + \frac{1}{R_{01}R_{03}C_{01}C_{02}}} \quad (4)$$

When the resistance values of $R_{01}$, $R_{03}$ and $R_{04}$, and the electrostatic capacities of the capacitors $C_{01}$ and $C_{02}$ are set in such a way that the constant term of the denominator polynominal in expression (4) becomes equal to the constant term of the demoninator polynominal in expression (3), and also the coefficient of the first order term of the demoninator polynominal in expression (4) becomes equal to the coefficient of the first order term of the demoninator polynominal in expression (3), the natural frequency ωr and the attenuation coefficient $\zeta_r$ in this circuit become equal to the r-th order vibration mode.

Now, when the current detected signal 31 is inputted to the terminal 331, an output signal outputted from the terminal 332 is proportional to the angular velocity of the r-th order mode with same sign indicated in the position of moving coil 13. Therefore, the output signal from the terminal 332 is negatively fed back to the output signal of the integral compensation circuit 24, whereby it is possible to stabilize the r-th order vibration mode, i.e., reduce the r-th order vibration.

In this embodiment, since the value of the resistor $R_{02}$ can be set independently of both the natural frequency and the attenuation coefficient, the value of resistor $R_{02}$ is made a variable resistor, whereby it is possible to adjust its amplitude of the output signal from the torsion r-th order vibration compensation circuit.

In addition, in the control block diagram shown in FIG. 1, there is shown the case where the torsion first order compensation circuit 33 and the torsion second order compensation circuit 34 are both used for stabilizing the first order mode and second order mode of the torsion vibration. In the case of compensating plural vibration modes, the torsion vibration compensation circuit shown in FIG. 2 is used for every mode and these circuits are connected in parallel with the torsion first order compensation circuit 33, the torsion second order compensation circuit 34 and the like, whereby it is possible to stabilize the torsion vibration of the desired degree.

Next, the angular velocity observer circuit 32 will hereinbelow be described. In the present invention, the angular velocity observer circuit 32 is used instead of the differential compensation circuit 26 (refer to FIG. 13) to estimate the angular velocity of the rigid body moment corresponding to the first term of expression (1). The resultant estimation signal is then negatively fed back to the output signal of integral compensation circuit 24, whereby it is possible to stabilize the servo system shown in FIG. 1.

Figure 3:
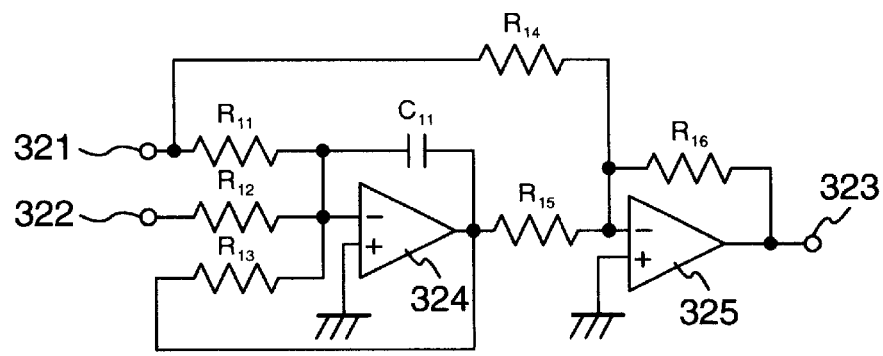
FIG. 3 is a circuit diagram showing a configuration of an angular velocity observer according to the present invention.

FIG. 3 is a circuit diagram showing a configuration of the angular velocity observer circuit 32 constituted by two operational amplifiers 324 and 325, six resistors $R_{11}$ to $R_{16}$ and a capacitor $C_{11}$. Plus side input terminals of the operational amplifiers 324 and 325 are both grounded. A minus side input terminal of the operational amplifier 324 is connected to ones terminals of the resistors $R_{11}$ to $R_{13}$ and one terminal of the capacitor $C_{11}$. The other terminal of the resistor $R_{11}$ is connected to a terminal 321 and one terminal of the resistor $R_{14}$, and the other terminal of the resistor $R_{12}$ is connected to a terminal 322. An output terminal of the operational amplifier 324 is connected to the other terminal of the capacitor $C_{11}$, the other terminal of the resistor $R_{13}$ and one terminal of the resistor $R_{15}$. A minus side input terminal of the operational amplifier 325 is connected to the other terminals of the resistor $R_{14}$ and the resistor $R_{15}$, and one terminal of the resistor $R_{16}$. An output terminal of the operational amplifier 325 is connected to the other terminal of the resistor $R_{16}$ and a terminal 323.

In this circuit, when the values of resistors $R_{11}$, $R_{13}$, $R_{14}$ and $R_{15}$ are set in such a way as to satisfy the relationship of expression (5), then the relationship between the signals inputted through the terminals 321 and 322 and the signal outputted through the terminal 323 is as shown in expression (6).

$$R_{11}R_{15} = R_{13}R_{14} \quad (5)$$

$$E_0(s) = \frac{\frac{R_{16}}{R_{14}}s}{s + \frac{1}{R_{13}C_{11}}}(-E_{i1}(s)) + \frac{\frac{R_{16}}{R_{12}R_{15}C_{11}}}{s + \frac{1}{R_{13}C_{11}}}E_{i2}(s) \quad (6)$$

where $E_{i1}(s)$ is Laplace transformation of the input signal 321 and is the signal obtained by inverting the sign of angle detection signal, $E_{i2}(S)$ is Laplace transformation of the input signal 322 and is the current detected signal 31, and $E_0(s)$ is Laplace transformation of the output signal 323 and is the angular velocity estimation signal.

The first order transfer functions of the first term and the second term in expression (6) have the common demoninator polymoninal, and the constant term, i.e., $1/R_{13}C_{11}$ is the cut-off angular frequency of each of the transfer functions. In the region in which the angular frequency is lower than this cut-off angular frequency, the differentiation of the angle detection signal becomes mainly an angular velocity estimation signal in correspondence to the first term of expression (6), while in the region in which the angular frequency is higher than that cut-off angular frequency, the integration of current detection signal becomes mainly an angular velocity estimation signal in correspondence to the second term of expression (6). Thus, the angular velocity of rigid body mode in the position of moving coil 13 can be estimated in high accuracy.

In the case where the angle detecting sensor is arranged apart from the moving coil 13, the angle detection signal in the frequency range close to the torsion frequency is deviated with respect to the angular displacement in the position of moving coil 13. In the case where the angle detecting sensor is then arranged apart from the moving coil 13, it is desirable to determine the value of resistor $R_{13}$ and the electrostatic capacity of the capacitor $C_{11}$ in such a way that the cut-off angular frequency becomes lower than the torsion vibration first order mode. As a result, since it is possible to reduce the degree at which the torsion frequency component of the angle detection signal is positively fed back, even if the bandwidth is made wider than that of the conventional servo system, it is possible to ensure the stability of the servo system.

Next, the description will be given with respect to an embodiment in which the mirror vibration due to the flexural vibration of the rotation shaft is adapted to be suppressed.

Figure 4:
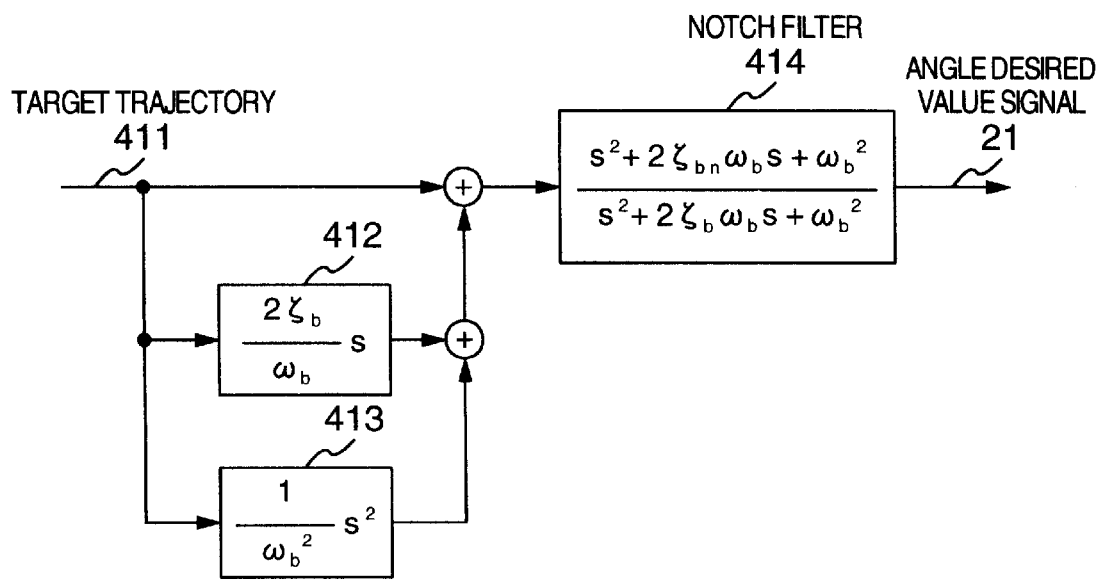
FIG. 4 is a block diagram useful in explaining a vibration suppression element according to the present invention.

FIG. 4 is a block diagram of the mirror vibration suppressing element 41 according to the present invention shown in FIG. 1. A target trajectory 411 is a target profile of the rotation angle of the mirror 11. In this case, an angle desired value is supplied to the mirror vibration suppressing element 41 from the mirror angle command circuit 20.

Now, the target trajectory 411 is defined as the shortest time trajectory of one body of inertia for carrying out the maximum acceleration and maximum deceleration for the same period of time, in the case where $\alpha_{MAX}$ shown in expression (7) is the maximum accelerated. In this case, L is a stroke from when the rotation starts at a time 0 to when the rotation stops at a time $T_M$. In this case, a time function $\alpha(t)$ of the acceleration, a time function $v(t)$ of the velocity and a time point $x(t)$ of a position are represented by expressions (8) to (10), respectively.

$$\alpha_{MAX} = \frac{4L}{T_M^2} \quad (7)$$

-continued $$\alpha(t) = \begin{bmatrix} \alpha_{MAX} & (0 \le t < 0.5T_M) \\ -\alpha_{MAX} & (0.5T_M \le t < T_M) \\ 0 & (T_M \le t) \end{bmatrix} \quad (8)$$

$$v(t) = \begin{bmatrix} \alpha^t_{MAX} & (0 \le t < 0.5T_M) \\ -\alpha_{MAX}(T_M - t) & (0.5T_M \le t < t_M) \\ 0 & (T_M \le t) \end{bmatrix} \quad (9)$$

$$x(t) = \begin{bmatrix} 0.5\alpha_{MAX}t^2 & (0 \le t < 0.5T_M) \\ L - 0.5\alpha_{MAX}(t - T_M)^2 & (0.5T_M \le t < T_M) \\ L & (T_M \le t) \end{bmatrix} \quad (10)$$

The time function x(t) of a position is then made the target trajectory 411, and also, an output of a differential element 412 and an output of a second order differential element 413 are added to the target trajectory 411, and the resultant signal is inputted to a notch filter 414. An output signal of the notch filter 414 is defined as an angle desired value signal 21. In this case, as the constant of notch filter, the angular vibration frequency $\omega_b$ is defined equal to the natural angular frequency of the flexural vibration of the rotation shaft 12. In addition, the constant $\zeta_b$ of the denominator polynominal and the constant $\zeta_{bn}$ of the numerator polynominal are set in such a way as to satisfy the relationship of $\zeta_b > \zeta_{bn}$.

Now, if it is assumed that Laplace transformation of the time function of the target trajectory 411 is X(s) and Laplace transformation of the angle desired value signal 21 is R(s), the relationship shown in expression (11) is established between X(s) and R(s), and also, the flexural vibration frequency component of the rotation shaft 12 is removed at the zero point of the numerator polynominal of the notch filter.

$$R(s) = \frac{s^2 + 2\zeta_{bn}\omega_b s + \omega_b^2}{s^2 + 2\zeta_b\omega_b s + \omega_b^2}\left(1 + \frac{2\zeta_b}{\omega_b}s + \frac{1}{\omega_b^2}s^2\right)X(s) \quad (11)$$

$$= \frac{s^2 + 2\zeta_{bn}\omega_b s + \omega_b^2}{\omega_b^2}X(s)$$

Therefore, if the angle desired value signal 21 is inputted to the feedback control system shown in FIG. 1, it is possible to suppress the vibration of mirror resulting from the positioning operation.

In addition, the notch filter has the phase delay depending on the coefficient of the demoninator polynominal, the demoninator polynominal of notch filter is however cancelled by adding the output of target trajectory 411, the output of differential element 412 and the output of second order differential element 413. As a result, the phase delay from the target trajectory 411 up to the angle desired value signal 21 is removed and hence it is possible to reduce the delay in the operation of positioning the mirror 11 with respect to the target trajectory 411.

As described above, though it is difficult that the flexural vibration, generated once, is attenuated through the feedback control in the present invention, since the input to the feedback control system, i.e., the angle desired value signal 21 is generated by the mirror vibration suppressing element 41, thereby preventing the flexural vibration of rotation shaft 12, it is possible to reduce the positioning error of the laser beam caused by the mirror vibration.

Now, when it is assumed that Laplace transformation of the target velocity as the first order differentiation of the time function of the target trajectory is V(s), and Laplace transformation of the target acceleration as the second order differentiation of the time function of the target trajectory is A(s), expression (11) can then be transformed into expression (12).

$$R(s) = X(s) + \frac{2\zeta_{bn}}{\omega_b}sX(s) + \frac{1}{\omega_b^2}s^2X(s) = X(s) + \frac{2\zeta_{bn}}{\omega_b}V(s) + \frac{1}{\omega_b^2}A(s) \quad (12)$$

Figure 5:
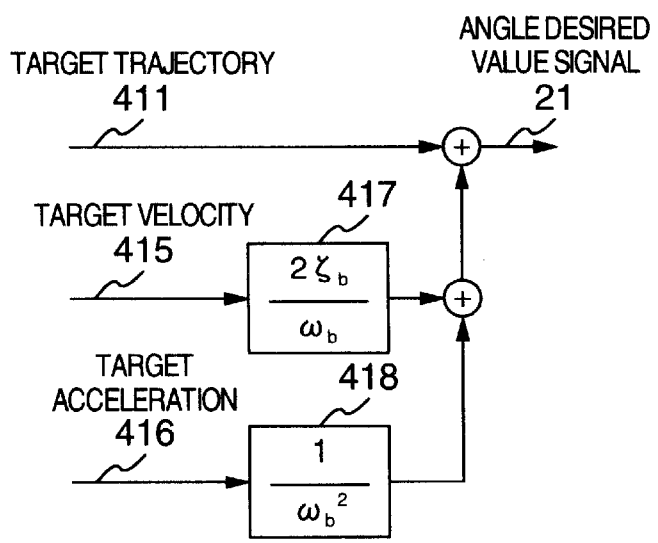
FIG. 5 is another block diagram useful in explaining a vibration suppression element according to the present invention.

FIG. 5 is a block diagram of the mirror vibration suppressing element according to the present invention which is configured to realize expression (12). In the figure, gain elements 417 and 418 are weighting coefficients each depending on the constant of notch filter 414. When the mirror vibration suppressing element is configured in such a manner, the target trajectory (refer to expression (10)), the target velocity (refer to expression (9)) and the target acceleration (refer to expression (8)) are subjected to the weighting addition, whereby even if the notch filter 414 shown in FIG. 4 is not clearly realized, it is possible to produce the angle desired value signal 21 which is equivalent to the mirror vibration suppressing element shown in FIG. 4.

Now, each of the mirror vibration suppressing elements shown in FIG. 4 and FIG. 5 can be readily realized by utilizing the microprocessor. In this case, when the feedback control system shown in FIG. 1 corresponds to the analog control, the digital angle desired value signal is converted into the analog signal by a D/A converter to be used, whereby the present invention can be applied thereto.

In this case, instead of calculating the target trajectory, the target velocity and the target acceleration on all such occasions, the procedure may also be adopted in which these time series values are previously calculated to be stored in the memory at the time of the positioning operation, therefore, the stored data is successively read out. In this case, if each of the target values is normalized using the stroke L to be stored in the memory, it is possible to reduce the memory capacity therefor.

In addition, several kinds of operation times $T_M$ may also be set depending on the magnitude of the stroke L.

Furthermore, the target trajectory is not limited to the target trajectory represented by expression (10). That is, the time waveform differentiated with the order equal to or higher than the degree of the denominator polynominal of the notch filter 414 can be defined a target trajectory.

In addition, when the angular vibration frequency $\omega_b$ of the notch filter 414 is made equal to the natural angular vibration frequency of the torsional vibration of the scanner movable part, it is possible to reduce the torsional vibration with the configuration different from the configuration which was stated with respect to the above-mentioned torsional vibration compensating circuit. In this case, the servo mechanism is not intended to be limited to the servo mechanism shown in FIG. 1, and hence the conventional servo mechanism shown in FIG. 13 may also be adopted.

FIG. 6 shows another embodiment of a controller for an optical scanner. A configuration of FIG. 6 is different from that of FIG. 1 in that a mirror 11, elements accompanying the mirror 11 and a sensor angle detecting circuit 35 are added to the elements shown in FIG. 6, and also the angle detection signal 22 is supplied to only the angle velocity observer circuit 32 and the proportional compensation circuit 25. The same constituent elements as those shown in FIG. 1 are designated with the same reference numerals and the detailed description thereof is omitted for the sake of simplicity. Referring now to FIG. 6, an angle sensor 16 for detecting the angle is arranged in the rotation shaft 12.

The mirror 11 has a mirror surface for reflecting the laser beam for the fabrication and a mirror surface 17a arranged on the back face of that mirror surface. A light emitting device 17b and a light receiving device 17c are arranged in such a way as to hold the mirror surface 17a between them. A semiconductor laser device for example can be employed as the light emitting device 17b, and a PSD (Position Sensitive Device) for example can be employed as the light receiving device.

Next, the description will be given with respect to the flow of the signals and the servo mechanism.

A mirror angle detection signal 17e (it is a voltage signal proportional to the angle of mirror 11) outputted from the light receiving device 17c is amplified in an amplifier 17d to be negatively fed back to the angle desired value signal 21 outputted from the mirror angle command circuit 20 to generate the tracking error signal 23. In order that the angle of the mirror 11 may be made follow the angle desired value without the steady-state deviation, the tracking error signal 23 is integrated in the integral compensation circuit 24 to be defined as a 1-type servo system. In addition, in order to ensure the stability of this servo mechanism, the angle detection signal 22 is inputted to the proportional compensation circuit 25 and the angular velocity observer circuit 32 and the sum of the output signals of these circuits 25 and 32 and an output signal 33a from the torsional vibration stabilizing compensation circuit 33 are subtracted from the output signal of the integral compensation circuit 24 to make the resultant signal the control input signal 27. The mirror driving circuit 28 supplies a motor driving current 19 proportional to the control input signal 27 to the optical scanner 1. The motor driving current 29 flows through the moving coil 13, so that the driving torque proportional to the current value is generated in the moving coil 13. In such a manner, it is possible to reduce the torsional vibration of the rotation shaft 12.

Now, in the case where the motor driving circuit 28 is of the current control system, normally, since the driving torque generated in the moving coil 13 is proportional to the motor current 29, the driving torque of moving coil 13 is made clear by measuring the motor current 29. In this case, for example, the motor current 29 flows through a current detecting resistor having a small resistance value (in the range of 0.1 to equal to or smaller than several $\Omega$) to input the voltage developed across that resistor to the differential input type subtraction circuit, whereby the current detection signal 31 proportional to the value of motor current 29 can be obtained in the form of an output of a differential input type subtraction circuit. Then, the current detected signal 31 proportional to the value of motor current 29 is inputted to the angular velocity observer circuit 32 and the torsional vibration stabilizing compensation circuit 33.

The position of the rotation shaft 12 detected by the angle sensor 16 is outputted in the form of the angle detected signal 22 from the sensor angle detecting circuit 35. The angle detected signal 22 is then inputted to the proportional compensation circuit 25 and the angular velocity observer circuit 32.

The description of the torsional vibration stabilizing compensation circuit 33 is the same as that of the torsion first order compensation circuit 33 already described with reference to FIG. 1.

Next, the torsional vibration characteristics of the movable part and the stability of the servo mechanism will be described on the basis of a concrete example of the optical scanner.

Figure 7A:
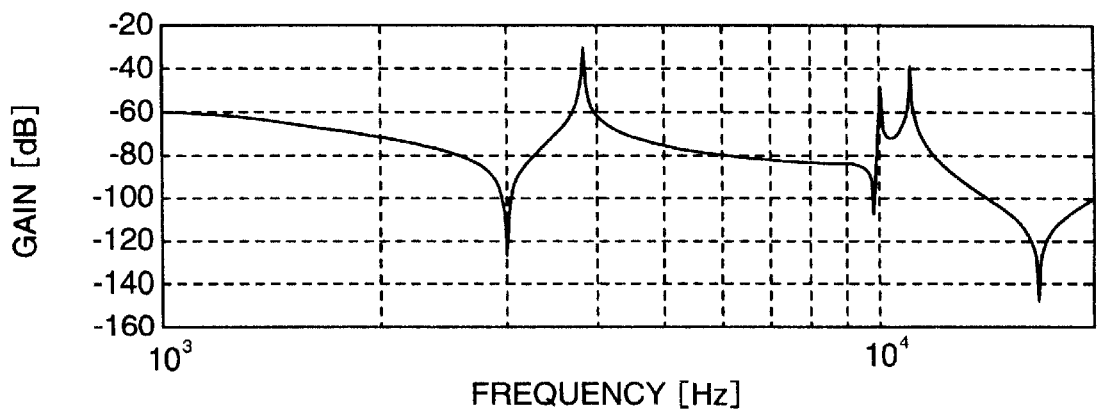
FIGS. 7A and 7B are Bode diagrams of an example useful in explaining the relationship of the gain and the phase against the frequency response from a motor current up to an angle detection signal.
Figure 7B:
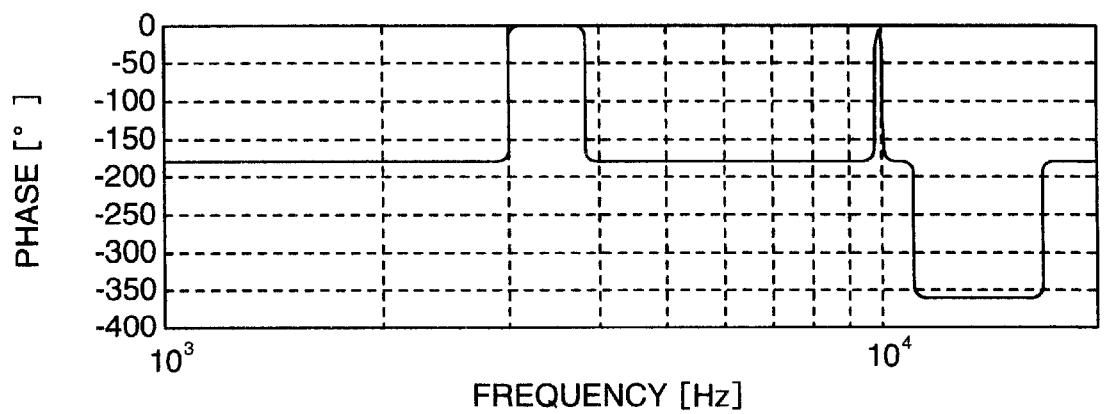

FIGS. 7A and 7B are Bode diagrams showing the relationship of the gain against the frequency response from the motor current 29 up to the angle detected signal 22. In addition, FIGS. 8A and 8B are Bode diagrams showing the relationship of the gain against the frequency response from the motor current 29 up to the mirror angle detection signal 17e.

Figure 8A:
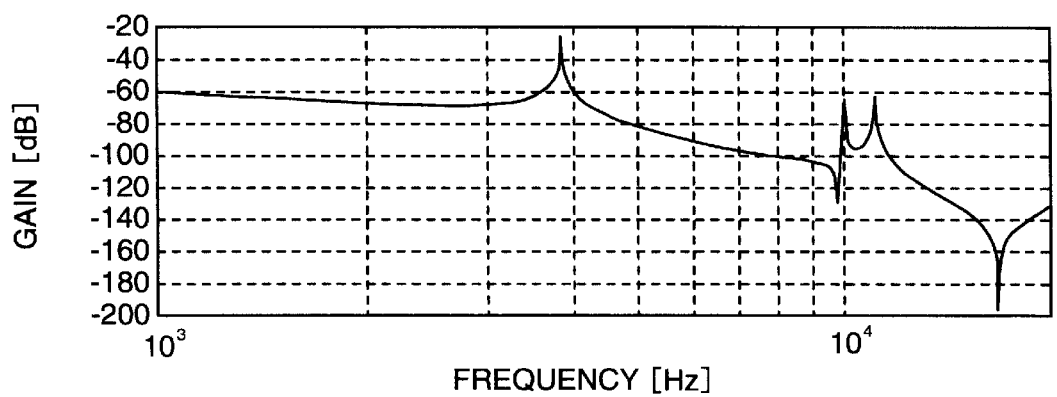
FIGS. 8A and 8B are Bode diagrams of an example useful in explaining the relationship of the gain and the phase against the frequency response from a motor current up to a mirror angle detection signal.
Figure 8B:
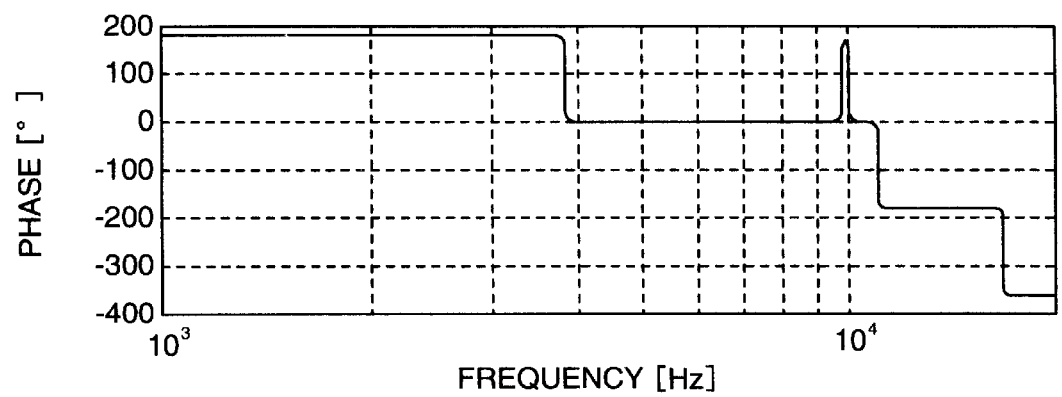

Comparing FIG. 7A and FIG. 8A with each other, the torsion first order resonance at 3.8 kHz, the torsion second order resonance at 10 kHz, and the torsion third order resonance at 11 kHz of FIG. 7A match those of FIG. 8B. In addition, in FIG. 7A, the antiresonance is present at 3 kHz, while in FIG. 8A, the antiresonance is absent in the vicinity of that frequency.

As knowledge of the vibration study in the structural system, it is possible to be aware of the in-phase property for each of the modes from the resonance and the antiresonance in the Bode diagram. In the case of FIG. 7A, the antiresonances are respectively present between the rigid body mode and the first order resonance and between the first order resonance and the second order resonance, while the antiresonance is absent between the second order resonance and the third resonance. Therefore, in the case of this optical scanner, the first order mode is in a phase with the second order mode between the moving coil 13 and the self-contained angle sensor 16, while the third order mode indicates an opposite phase between the moving coil 13 and the self-contained angle sensor 16.

On the other hand, in the case of FIG. 8A, the antiresonance is absent between the rigid body mode and the first order resonance, one antiresonance is present between the first order resonance and the second order resonance, and the antiresonance is absent between the second order resonance and the third order resonance. Therefore, in the case of this optical scanner, the first order mode and the second mode indicate an opposite phase and the third order mode is in a phase between the moving coil 13 and the mirror 11.

The servo mechanism shown in FIG. 6 is employed to the optical scanner 1 having such characteristics, i.e., the mirror angle detection signal 17e is not used in the proportional compensation circuit 25 and the angular velocity observer circuit 26, but the angle detection signal 22 which becomes in phase in the lower order modes (the first order mode and the second order mode) is used therein to carry out both the proportional compensation and the differential compensation, whereby it is possible to ensure the stability of the servo system.

In this case, since the third order mode is also the opposite phase, in order to make the servo frequency band wider, it is necessary to subject this mode to the stabilizing compensation. In addition, even if the in-phase mode does not come to the stabilization of the servo system, it may become the factor of causing the residual vibration to reduce the positioning accuracy, the compensation of attenuating speedily the vibration is required. This compensation can then be carried out in the torsional vibration stabilizing compensation circuit 33 in which the current detected signal 31 is treated as the input thereof.

Figure 9A:
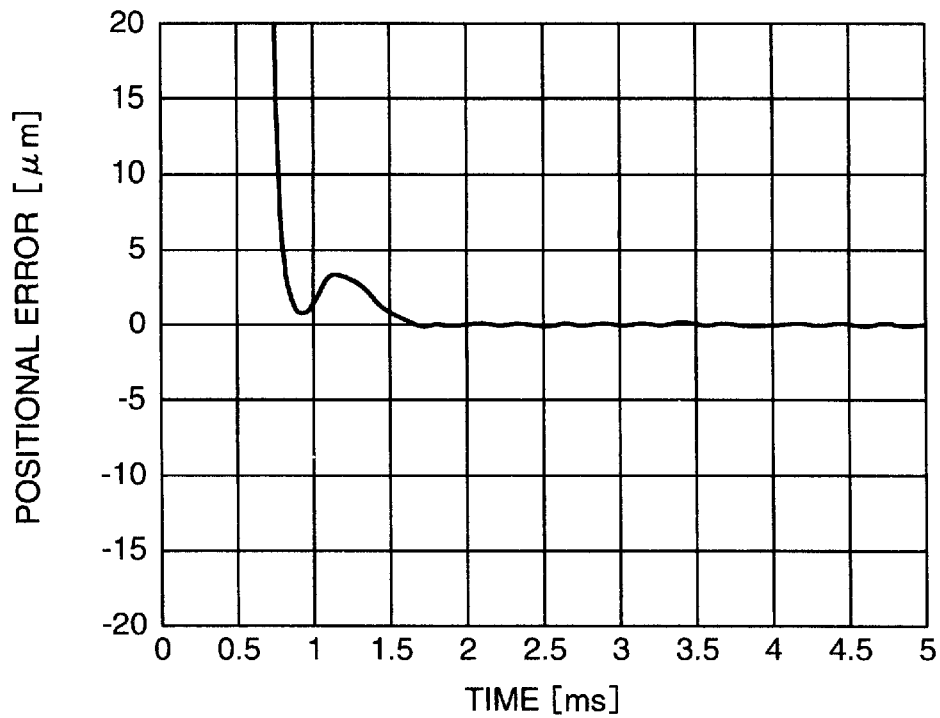
FIGS. 9A and 9B are characteristic curves explaining the relationship between the lapse of time from the start of the mirror operation up to the stop thereof and the positioning error.
Figure 9B:
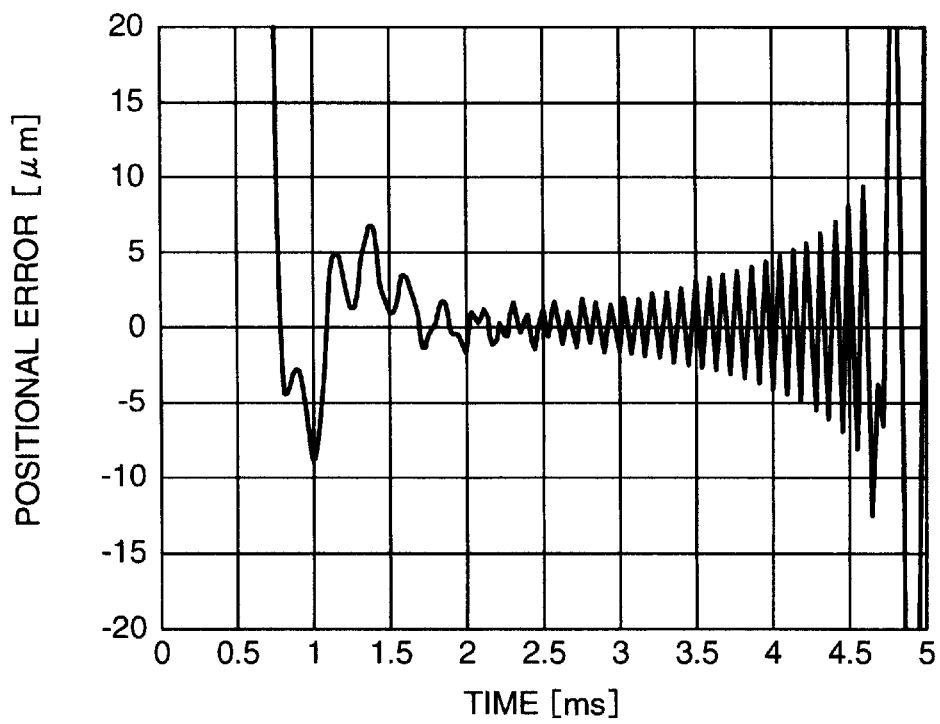

FIG. 9A and FIG. 9B are curves explaining the relationship between the elapsed time and the positional deviation with the vicinity of the positional error=0 enlarged. FIG. 9A shows the case where the torsional vibration stabilizing compensation circuit 33 according to the present invention uses the first to third order modes, and FIG. 9B shows the case where the conventional integral compensation, proportional compensation and differential compensation (I-PD compensation) are only carried out.

By using the torsional vibration stabilizing compensation circuit 33, the stable transient response is obtained in the case of the present invention, and it takes the mirror about 0.8 ms to reach a position where is 10 μm right before the target position in terms of the laser beam application position. On the other hand, in the conventional case, the positional deviation becomes unstable since the third order mode (at 11 kHz) indicates the opposite phase, and it oscillates at this resonance frequency.

In addition, in the present invention, since the signal of the mirror angle is fed back to the angle desired value signal 21 to carry out the integral compensation of the tracking error signal 23, the error of the laser beam irradiation position at a time of halting the mirror can be matched with the target position.

Now, with respect to the loop transfer function in the servo mechanism shown in FIG. 6, the magnitude of stability is evaluated on the basis of the Nyquist stability criterion method.

Figure 10:
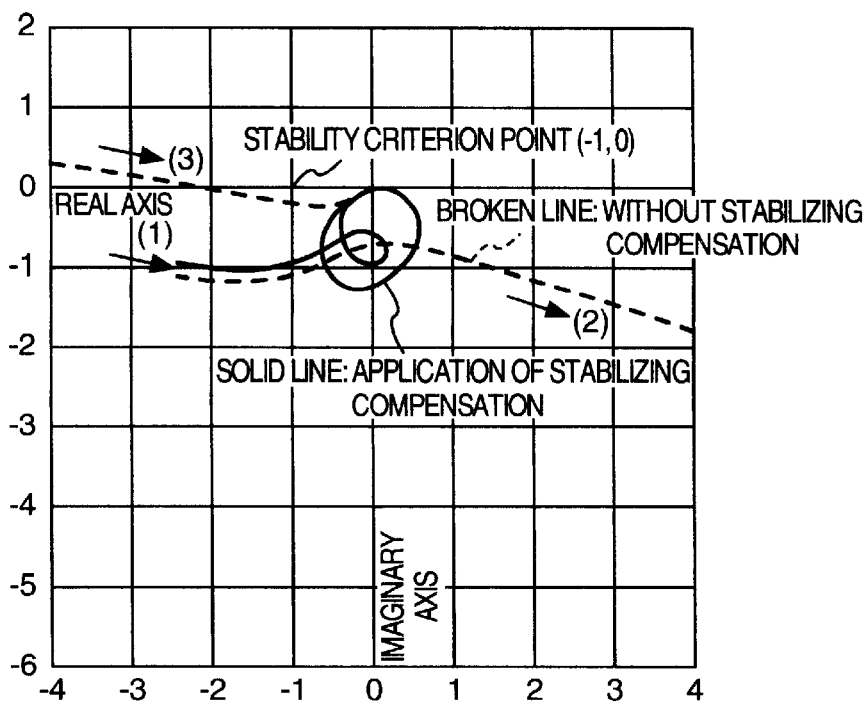
FIG. 10 is an explanatory diagram explaining the Nyquist locus when it is assumed that the error of the natural frequency is absent at all.

FIG. 10 shows the Nyquist locus in the frequency range (in the range of 1 to 7 kHz) containing therein the natural frequency of the first order mode (at 3.8 kHz) in the case where the torsional vibration stabilizing compensation circuit 33 is designed on the assumption that the error of the natural frequency is absent at all. In the figure, a solid line represents the case where the stabilizing compensation for the first order mode is applied, while a broken line represents the case where the stabilizing compensation for the first order mode is not applied conventionally.

The locus in the case where the stabilizing compensation is not applied goes forward from arrows (1) to (2) and thereafter goes outside the frame of graph to describe a circular locus in the clockwise direction to return back within the frame of this graph to reach arrow (3). This circular locus means that the gain increases in the vicinity of the first order resonance. In addition, this locus comes close to the stability criterion point of the coordinates (−1, 0), and hence the phase margin is very small. On the other hand, in the case where the stabilizing compensation is applied, the distance from the origin to the locus becomes short, and hence both of the phase margin and the gain margin for the stability criterion point become large. Therefore, it is understood that in the compensation circuit which is free from the error of the natural frequency there is offered the effect that the stability of servo system increases by suppressing the resonance peak to the small degree.

Now, in order to design the torsional vibration stabilizing compensation circuit 33, it is necessary to measure the natural frequency of the vibration mode which is intended to be compensated for. It is possible to be aware of the natural frequency of vibration mode which is intended to be compensated by measuring the frequency response as shown in FIG. 7A. However, since the measurement accuracy thereof depends on the performance and the resolution of the used measuring instrument (e.g., the servo analyzer), the error is necessarily contained therein. In addition, it is considered that the natural frequency itself of the scanner is not always fixed, and hence varies due to the influence of heat build-up and the like by the motor. Even if these error and variation occur, it is practical to maintain the stability of the control.

The description will be given with respect to the construction of the servo mechanism which is robustly stable against the error of the frequency of the torsional vibration.

Figure 11:
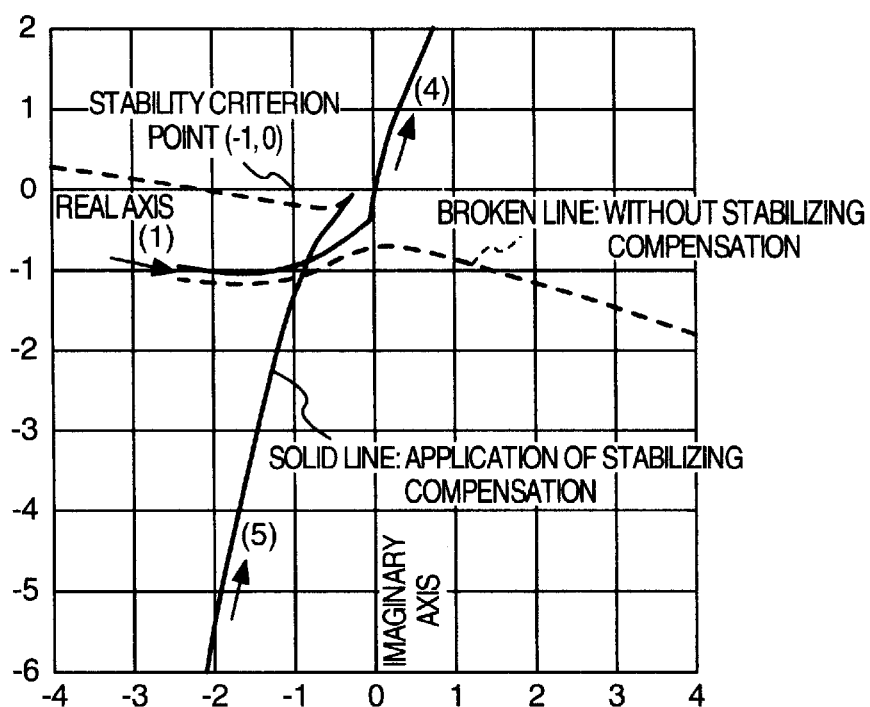
FIG. 11 is an explanatory diagram explaining the Nyquist locus when the natural frequency is deviated from the natural frequency of the actual first order mode.

FIG. 11 shows the Nyquist locus in the frequency range (in the range of 1 to 7 kHz) containing therein the natural frequency of the first order mode (at 3.8 kHz) in the case where the torsional vibration stabilizing compensation circuit 33 is designed in such a way that the natural frequency of the torsional vibration stabilizing compensation circuit 33 is set to 3.61 kHz which is lower than the natural frequency of 3.8 kHz of the actual first order mode by 5% (190 Hz). In the figure, a solid line represents the case where the stabilizing compensation for the first order mode is applied, while a broken line represents the case where the stabilizing compensation for the first order mode is not applied conventionally (the locus is the same as the broken line of FIG. 10).

The locus in the case where the stabilizing compensation is applied goes forward from arrows (1) to (4) and thereafter goes outside the frame of this graph to describe a circular locus in the clockwise direction to return back within the frame of this graph to reach arrow (5). Though the distance from the origin to the locus is not so short as in the case of FIG. 10, the phase in the vicinity of the first order resonance is made lead the phase in the case where the stabilizing compensation is not applied so that the phase margin for the stability criterion point is increased. As a result, it is understood that the stability of the servo system is enhanced.

The reason that the stability of the servo system is enhanced in such a manner is as follows. In this compensation circuit, in the vicinity of the natural frequency, the phase is made lag up to about 90 degrees at maximum on the side of the frequency which is lower than the natural frequency, while the phase is made lead up to about 90 degrees at maximum on the higher frequency side. For this reason, if the natural frequency of the actual mode is relatively higher than that of the compensation circuit, then the phase of the Nyquist will lead in the vicinity of the resonance point of this mode.

In such a manner, the torsional vibration stabilizing compensation circuit 33 can be utilized as the phase compensator for the resonance. Then, the natural frequency of the compensation circuit is designed in such a way as to be deviated from the surveyed value, whereby it is possible to realize the servo mechanism which is robustly stable against the error and the variation of the vibration frequency.

In this example, since the first order mode is in phase, the setting is carried out in such a way that the natural frequency of the compensation circuit is shifted to the lower frequency side to make the phase lead, when the out-of-phase mode (e.g., the third order mode) is stabilized, the setting may be carried out in such a way that the natural frequency of the circuit is shifted to the higher frequency side to make the phase lag.

In addition, positive and negative of the deviation of the vibration frequency are determined in correspondence to the in-phase or the out-of-phase of the mode in such a way that the phase margin is increased. Furthermore, the magnitude of deviation needs to be determined in such a way that even though the maximum error and variation are supposed to be occurred, the great and small sizes of the actual natural frequency and the natural frequency of the compensation circuit are not reversed.

While the present invention has been particularly shown and described with reference to the embodiments, it will be understood that the various changes and modifications will occur to those skilled in the art without departing from the scope and true spirit of the invention. The scope of the invention is therefore to be determined solely by the appended claims.

What is claimed is:

1. A controller for an optical scanner for positioning a mirror supported by a rotation shaft in accordance with an angle desired value and an angle detected value, wherein a correction value related to a torsional vibration of said rotation shaft is added to an integral value of a tracking error value between the angle desired value and the angle detected value.

2. A controller for an optical scanner according to claim 1, wherein the correction value is defined as an output value of a transfer function ($H_r(s)$) up to the r-th order angular velocity (r is integer) of the torsional vibration of said rotation shaft caused by a driving torque applied to said rotation shaft.

3. A controller for an optical scanner according to claim 2, wherein the output value of the transfer function is calculated from a current value supplied to a motor for generating the driving torque.

4. A controller for an optical scanner for positioning a mirror supported by a rotation shaft in accordance with an angle desired value and an angle detected value, wherein a target trajectory is defined as a time function X(t) of a position of said mirror, and a specific frequency component is removed from a sum of the target trajectory; and a target velocity and a target acceleration based on the target trajectory to make the angle desired value.

5. A controller for an optical scanner according to claim 4, wherein the specific frequency component is defined as a natural frequency component of a flexural vibration of said rotation shaft.

6. A controller for an optical scanner according to claim 4, wherein the specific frequency component is defined as a natural frequency component of the torsional vibration of said rotation shaft.

7. A controller for an optical scanner for positioning a mirror supported by a rotation shaft in accordance with an angle desired value and an angle detected value, said controller comprising:

mirror angle detecting means for detecting an angle of a mirror;

rotation shaft angle detecting means for detecting an angle of said rotation shaft;

current detecting means for detecting a current supplied to a motor for rotating said rotation shaft; and torsional vibration stabilizing compensation means for stabilizing a torsional vibration of said rotation shaft in accordance with a current value, wherein a value subjected to a proportional compensation and a differential compensation by using a rotation shaft angle detected value and a value from said torsional vibration stabilizing compensation means are negatively fed back to a value obtained by integrally compensating for a tracking error between the angle desired value and a mirror angle detected value to determine a current value to be supplied to said motor.

8. A controller for an optical scanner according to claim 7, wherein said mirror angle detecting means includes: a light emitting device for measuring an mirror angle; a measuring mirror surface for reflecting a light beam emitted from said light emitted device; and a light receiving device for receiving a reflected light beam reflected from said mirror surface in accordance with the light beam emitted from said light emitting device.

9. A controller for an optical scanner according to claim 7, wherein said torsional vibration stabilizing compensation means has a characteristic of increasing a phase margin of a loop transfer function in vicinity of the torsional vibration frequency.

10. A controller for an optical scanner according to claim 7, wherein said torsional vibration stabilizing compensation means has a natural frequency, a difference between the natural frequency and the torsional vibration frequency of a scanner movable part being set to a value equal to or larger than a maximum value of a variable amount of the torsional vibration frequency.

* * * * *